(12) United States Patent
Dewey, III et al.

(10) Patent No.: US 6,477,686 B1
(45) Date of Patent: Nov. 5, 2002

(54) METHOD OF CALCULATING 3-DIMENSIONAL FRINGE CHARACTERISTICS USING SPECIALLY FORMED EXTENSION SHAPES

(75) Inventors: L. William Dewey, III, Wappingers Falls, NY (US); Peter A. Habitz, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/560,577

(22) Filed: Apr. 27, 2000

(51) Int. Cl.$^7$ .................................................. G06F 17/50
(52) U.S. Cl. ................ 716/5; 378/108; 716/1; 716/2; 716/5; 716/10; 716/11
(58) Field of Search ................ 716/1, 2, 4, 5, 716/10, 11; 378/108

(56) References Cited

U.S. PATENT DOCUMENTS

| | | | |
|---|---|---|---|
| 6,185,722 B1 * | 2/2001 | Darden et al. ................ | 716/5 |
| 6,404,851 B1 * | 6/2002 | Possin et al. ................ | 378/108 |
| 6,405,350 B1 * | 6/2002 | Tawada ........................ | 716/4 |

* cited by examiner

*Primary Examiner*—Matthew Smith
*Assistant Examiner*—Thuan Do
(74) *Attorney, Agent, or Firm*—McGinn & Gibb, PLLC; Richard M. Kotulak, Esq.

(57) ABSTRACT

A structure and method for performing a capacitance extraction on an integrated circuit, includes determining a parallel-plate capacitance between devices on different levels within the integrated circuit, adding extension shapes around each of the devices, reducing an area of overlapping extension shapes, multiplying a remaining area of the extension shapes by a constant to produce a fringe capacitance; and summing the parallel-plate capacitance and the fringe capacitance.

30 Claims, 4 Drawing Sheets

METHOD OF CALCULATING 3-DIMENSIONAL FRINGE CHARACTERISTICS USING SPECIALLY FORMED EXTENSION SHAPES

BACKGROUND OF THE INVENTION

1. Field of the Invention

The present invention generally relates to a system and method for capacitance extraction of an integrated circuit design and more particularly to an improved system and method which utilizes extension shapes to more accurately calculate capacitance near corners.

2. Description of the Related Art

In the design of a very large scale integrated (VLSI) circuit, one process involves extracting the parasitic capacitance of the devices and wiring within the structure. Accurate extraction of 3-dimensional conductor shapes with field calculations is very time consuming due to the large number of interacting conductor surfaces. Therefore, various techniques are used to simplify the calculation of parasitic capacitances, while maintaining an acceptable level of accuracy. Many conventional extraction programs are available to calculate the parasitic capacitance of the devices as viewed from the top in a two-dimensional plane. Any capacitance originating on the vertical edges of wiring and structures within such a two-dimensional plane and leading to a horizontal or vertical surface on a different layer is referred to as a "fringe capacitance". The invention resolves the difficulty of calculating the fringe capacitance when working in a two-dimensional model, especially when adjacent structures interfere with or "screen" the fringe capacitance.

Typically, conventional extraction programs provide a unique algorithm for fringe capacitance wherein, a value is multiplied by the linear edge length of a structure. Such an algorithm is acceptable for straight structures which do not have closely spaced neighboring structures. However, when the devices for wiring have corners or are closely spaced, the multiplication constant in the conventional algorithm must be adjusted in a customized manner to account for the corner or the closely spaced neighbor. Therefore, there is a need for an automated system which simplifies the calculation of fringe capacitance when performing capacitance extraction on an integrated circuit design.

SUMMARY OF THE INVENTION

It is, therefore, an object of the present invention to provide a structure and method for performing a capacitance extraction on an integrated circuit, that includes determining the parallel-plate capacitance between conductors on different levels within the integrated circuit, adding extension shapes around each of the conductors, allowing overlapping of the extension shapes and reducing the total extension shape area, distributing the overlapping extension shapes to the conductor nets involved, multiplying the remaining area of the extension shapes and the overlapping area each by properly chosen constants to produce a fringe capacitance; and summing the parallel-plate capacitance and the fringe capacitance.

The extension shape is a two-dimensional annular shape. The overlapping extension shapes reduce the fringe capacitance within a level of the integrated circuit. The constant is based on a parallel-plate capacitance between each of the extension shapes and an extension shape or device in another level of the integrated circuit. The extension shapes are imaginary items added to the integrated circuit for the purpose of the capacitance extraction only and are not included in the finally manufactured product.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
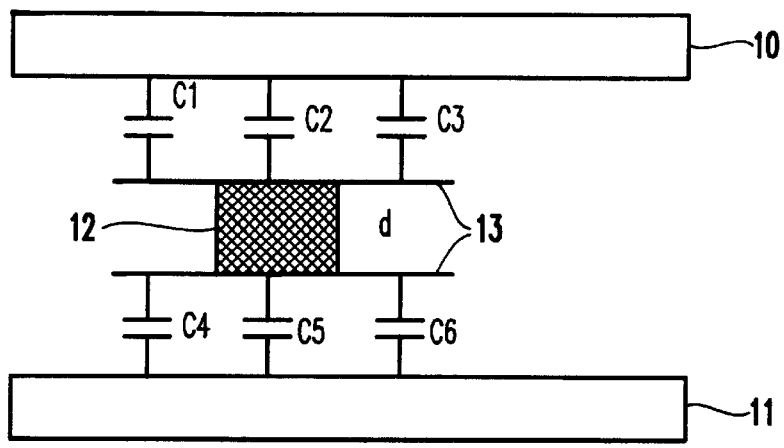
FIG. 1 is a schematic diagram illustrating a cross-sectional view of multiple layers of an integrated circuit structure.

As mentioned above, vertical surfaces, which produce fringe capacitances, are typically poorly modeled in conventional extraction tools as they depend on the distance to the neighbor on the same level and the vertical distance to adjacent levels. Furthermore, conventional fringe capacitance constants need modification on each corner, depending on the change of the involved geometries. However, most conventional extraction tools are very efficient in measuring the area of overlapping shapes. This invention uses this well-developed "overlapping" ability to produce a method that transforms the 3-dimensional fringe capacitance extraction problem into a system that needs only to determine overlap areas of specially constructed 2-dimensional shapes.

The invention introduces an annular shape, called an extension shape, that is created around each conductor shape and represents the fringe capacitance. Fringe capacitance from a vertical surface to a horizontal surface above or below is roughly proportional to the area of overlap of the extension shape and the associated conductor shape above or below. In this way the fringe capacitance is transferred into an area capacitance.

Like most extraction programs, the invention separates the capacitance of a wire into area components, perimeter components and line to line components. The invention assumes, like many other programs, that the fringe capacitances up and down and right and left are independent from each other.

For the area component, the invention uses the parallel plate capacitance like most other programs do. For the line to line coupling, the invention uses a system that analytically calculates the line to line coupling as a function of the distance to the next conductor in the same level and also of the vertical distance to the next conductor above and underneath. What is missing in conventional approaches is the lateral fringe capacitance into the end of a wire. If there are very short and very many parallel wires, the fringe capacitance into the end of a wire can add up and therefore, the invention makes an adjustment in the same framework as the treatment of up-down fringe capacitance.

As explained in greater detail below, the fringe up-down capacitance is transferred into area capacitance with the invention through the use of the extension shapes. Parallel plate capacitance formulas are applied to the additional areas, virtual (e.g., extension shape) to original (e.g., actual device or wiring), virtual to virtual, and overlapping virtual to original or virtual. The amount of the extension and the capacitance values are fitting parameters. This method improves accuracy and numerical efficiency.

The following table explains further the different choices for area capacitance values between shapes on two different levels.

|  | original | extension | overlapping extension |
|---|---|---|---|
| original | Cpp | Cf1 | Cf2 |
| extension | Cf1 | Cf11 | Cf12 |
| overlapping ext | Cf2 | Cf12 | Cf22 |

Here Cpp is the parallel plate capacitance between two devices. Cf1 is the area capacitance between a device and an extension shape. Cf2 is the area capacitance between a device and an overlapping extension shape. Cf11 is the area capacitance between two extension shapes. Cf12 is the area capacitance between an extension shape and an overlapping extension shape. Cf22 is the area capacitance between two overlapping extension shapes.

The invention includes the reduction of fringe capacitance due to close neighbors on the same level. The invention also accommodates for 3-dimensional fringe crossing wires and corner effects. The invention accounts for screening of intermediate wires and the interaction of off-center wires over and under. The invention allows the inclusion of pattern density fill shapes without increasing runtime. The invention is efficient because the additional screening reduces the number of shapes to be resolved.

Figure 2:
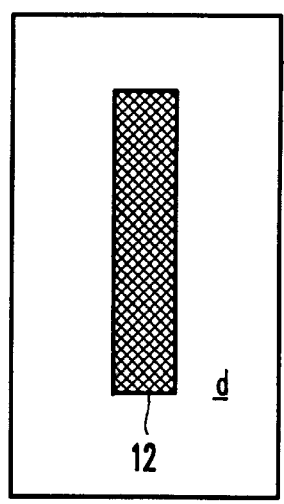
FIG. 2 is a schematic diagram illustrating a top view of a wiring structure and a surrounding extension shape.

Referring now to the drawings, and more particularly to FIGS. 1 and 2, a cross-sectional schematic illustration of two devices (or wires) 10, 11 and an interceding wiring feature 12 are illustrated. Also, FIGS. 1 and 2 illustrate the extension shape 13 that is introduced by the invention. The extension shape 13 represents the fringe capacitance in a 2-dimensional manner.

As mentioned above, the extension shape 13 is a 2-dimensional shape that extends outward a distance d from the wiring structure 12. The invention calculates fringe capacitance by multiplying a predetermined variable by the 2-dimensional area of the extension shape 13. Therefore, in the top view shown in FIG. 2, the extension shape 13 is shown to surround the wiring feature 12. However, in FIG. 1 (which is a cross-sectional view) the extension shape 13 appears only as a line, once again because of the 2-dimensional nature of the extension shape.

FIG. 1 shows how the extension shape 13 allows the calculation of fringe capacitance C1, C3, C4, C6 produced by the vertical walls of the wiring feature 12. This process converts the fringe capacitance into a simple area calculation, similar to that used to calculate parallel plate capacitances. As discussed above, conventional methods would merely measure the linear length of the edges shown in FIG. 2 by a predetermined constant to calculate the fringe capacitance.

In the simplistic structure illustrated in FIGS. 1 and 2, the conventional fringe capacitance extraction program and the inventive system would produce similar results with similar processing efforts. However, as discussed below in greater detail with respect to the remaining Figures (such as FIG. 3), when corners and neighboring shapes interfere with the fringe capacitance, the invention's extension shape allows a simplified calculation (made with the overlap of extension shapes) to accommodate for the corners and neighboring structures. Again, as mentioned above, the conventional fringe capacitance extraction programs require modification of the constant being multiplied by the linear length. This conventional modification is very complex, requires extensive processing time, and dramatically increases the cost of the extraction process. To the contrary, the invention does not modify the capacitance value, but instead merely makes adjustments in the area of the extension shapes based upon the amount of overlap of the extension shapes with other extension shapes within the same level of the integrated circuit.

As mentioned above, the state of the art with respect to calculations of overlapping shapes is very well advanced. Its application to the calculation of fringe capacitance values allows the teachings of that different art field (e.g., overlapping shape design) to simplify and dramatically increase the efficiency and accuracy of fringe capacitance calculations.

More specifically, capacitances C2 and C5 shown in FIG. 1 are the parallel plate capacitances between the wiring structure 12 and the components 10, 11. Capacitances C1, C3 are the fringe up capacitance and C4 and C6 the fringe down components. They are calculated as area capacitances for an extension shape 13 of width d around the wire 12. Once again, this is fundamentally different than the conventional method, as discussed above. The fringe capacitance per $um^2$ of the extension shape 13 and the width d are fitting parameters and are calculated using historical and empirical information.

Figure 3:
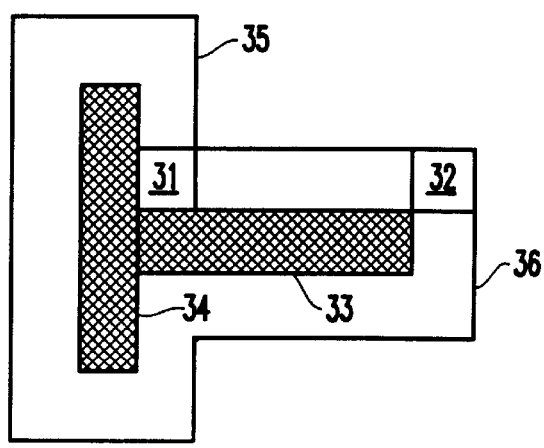
FIG. 3 is a schematic diagram illustrating a top view of a wiring intersection and surrounding extension shapes.

FIG. 3 is a schematic diagram that illustrates examples of how the invention outperforms conventional systems. FIG. 3 illustrates an intersection of wires 33, 34 each of which has a respective extension shape 36, 35. The point of the corner of shape 33 next to box 32 has no linear length. Therefore, conventional fringe capacitance extraction programs must be adjusted to compensate for the fringe capacitance which is in box 32. To the contrary, since the invention provides the extension shape 36, no additional calculation or modification is required to account for the fringe capacitance which occurs in area 32.

An additional distinction of the invention when compared to conventional systems can be seen by referring to Box 31. Once again, the conventional fringe capacitance extraction methods concentrate exclusively upon linear edge length of conductive structures. Therefore, the conventional fringe extraction programs would multiply the length of the left side and bottom of Box 31 by the predetermined capacitance value. However, this conventional calculation would incorrectly double the fringe capacitance in Box 31. Therefore, once again, additional custom modifications must be made to the conventional system to accommodate for the area 31. To the contrary, the invention simply multiplies the fringe capacitance value by the area within extension shapes 35, 36. Any conventional shaping calculation would eliminate the redundancy in area 31 (e.g., reduce the total area by one-half of the overlap) and thereby eliminate any need for a modification or customization of the multiplication constant, as is required conventionally.

Figure 4:
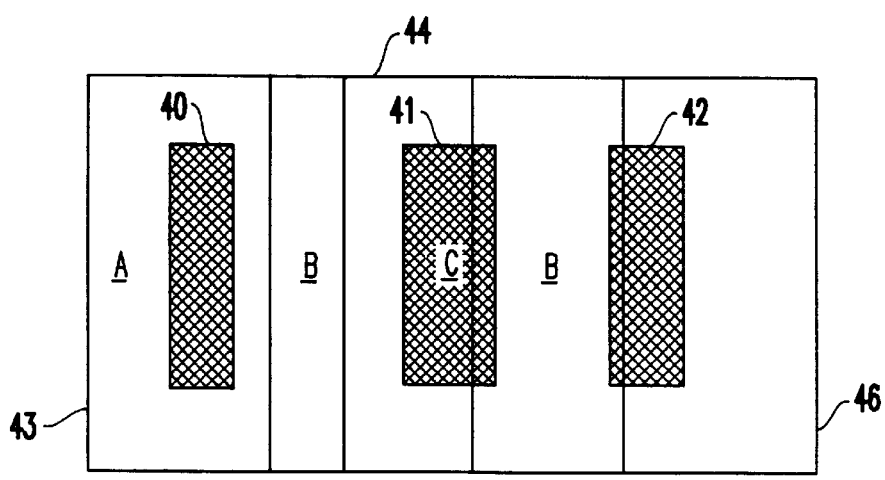
FIG. 4 is a schematic diagram illustrating a top view of devices and corresponding surrounding extension shapes.

FIG. 4 illustrates another structure that includes three devices 40–42 having respective extension shapes 43–46. Area A represents the unmodified fringe capacitance discussed above. Area B represents an overlap of two extension shapes. Area C represents an overlap of an extension shape 46 over a structure 41. Each of the devices 40–42 may be portions of different nets. Each overlapping area (e.g., B or C) is divided equally between the adjacent devices. Therefore, the fringe capacitance originating from overlapping area B is equally divided between the nets associated with structures 40 and 41 for each of the different nets.

Once again, the invention easily accommodates closely spaced neighboring structures by calculating the area of the extension shapes using any of a wide variety of well-known overlap calculations. Then, the invention easily multiplies the predetermined fringe capacitance area constant by the actual area resulting after the extension shapes are overlapped to produce the fringe capacitance of the entire group of structures.

With reduced distance between neighboring structures the fringe area gets smaller due to interaction with the next wire and the area B. The overlapping area B gets further reduced by the area C. In this way the fringe cap gets smaller with reduced area. The fit is done to ensure the correct values for single wires and close wires.

Figure 5:
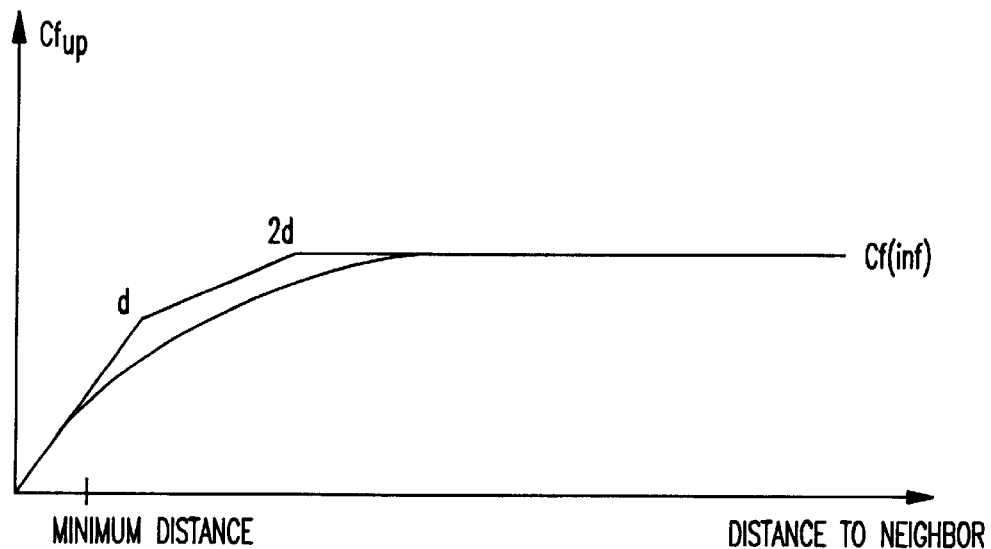
FIG. 5 is a chart illustrating the capacitance vs. distance to a neighboring structure.

FIG. 5 is a graph illustrating the nature of the approximation of the value d and shows the fringe up or down capacitance as a function of the distance to the next conductor on the same layer. At large distances the fringe cap has its asymptotic value and does not change any more with distance to its neighbor. This is one fitting point (e.g., $2d$). The fringe capacitance and the slope at minimum distances for this technology is the other fitting point d. The extension size d is chosen to approximate the curve reasonably well. Between the points d and $2d$ the extension shapes overlap and the area on which the fringe capacitance is based grows linearly with the distance to the neighbor.

Figure 6:
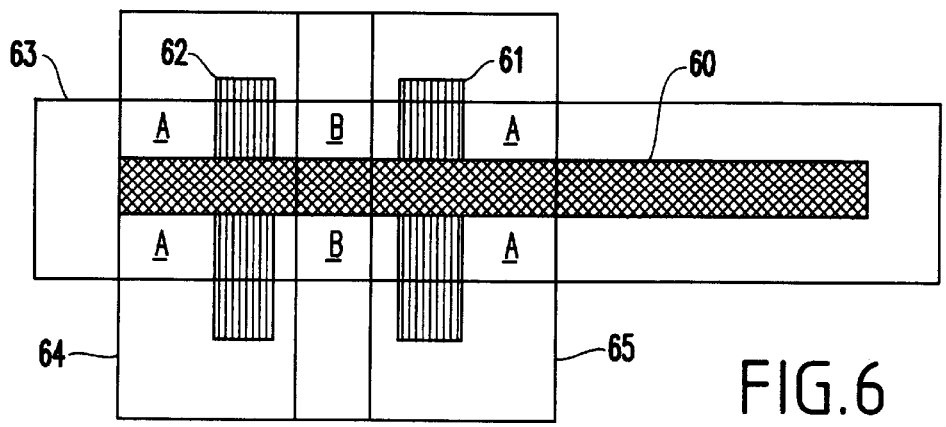
FIG. 6 is a schematic diagram illustrating a top view of wiring intersections and surrounding extension shapes.

FIG. 6 is a schematic diagram illustrating the invention's ability to accommodate intersecting wiring. More specifically wire 60 intersects wires 61 and 62 on different levels within the integrated circuit device. As with the previous examples, each shape includes its own extension region 63–65. Region A is the interaction (overlapping) of extension shapes of different levels and represents the 3D fringe to fringe interaction of crossing wires. Area B is the overlapping extension of one level to the extension of the other level, representing the reduction of the fringe due to close neighbors 61, 62 on the same level. The capacitance for area A is fitted to get this area right between crossing wires, assuming orthogonal wire scheme. While this capacitance is 70% of the total capacitance of the crossing wire capacitance, it is neglected in many conventional extraction tools.

Figure 7:
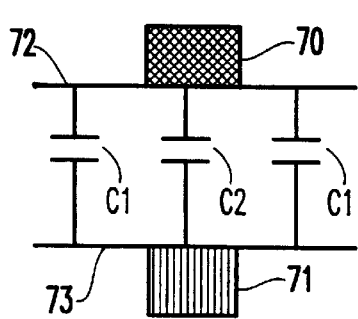
FIG. 7 is a schematic diagram illustrating a cross-sectional view of different wiring levels and capacitance between the wiring levels.
Figure 8:
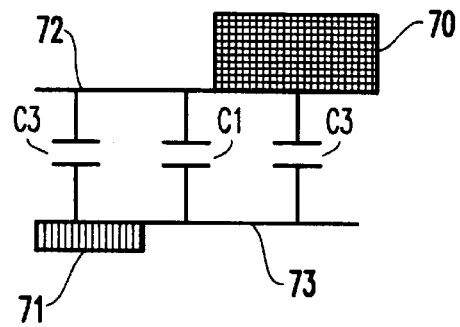
FIG. 8 is a schematic diagram illustrating a cross-sectional view of different wiring levels and capacitance between the wiring levels.

FIG. 7 illustrates a cross-sectional view of two wires 70, 71 on different levels within an integrated circuit. Each wire includes an extension shape 72, 73. The capacitance C1 is that formed between the extension shapes and the capacitance C2 is that formed between the parallel plates 70, 71. FIG. 8 is a schematic diagram illustrating a similar structure wherein the wires 70, 71 are offset from one another. Therefore, in FIG. 8 the capacitance C3 is that between the extension regions 72, 73 and the opposing wiring structure 70, 71.

Thus, C1 is the interaction of fringes on stacked wires. This value is again its own fitting parameter on wires running in the same direction. When wires are shifted off-center (FIG. 8) then the interaction is slowly reduced. Without additional methods, the invention also accommodates these off-center interactions.

Figure 9:
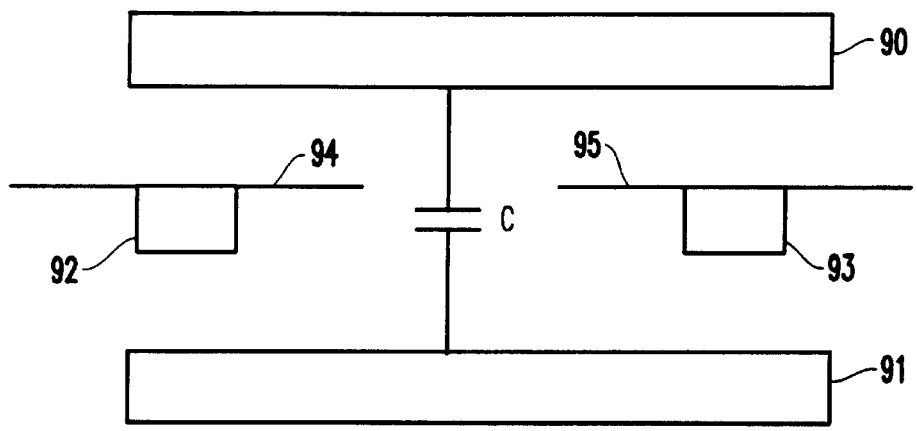
FIG. 9 is a schematic diagram illustrating a cross-sectional view of different levels and the capacitance between such levels.

FIG. 9 is a schematic diagram of devices 90, 91 on different levels separated by a wiring level having wires 92, 93. Again, as with the previous examples, extension shapes 94, 95 are included by the invention. The extension shapes of layers 90 and 91 are not illustrated for clarity. The extensions 92, 93 on the intermediate level reduces the area available for the calculation of capacitance C. In this way the invention also accommodates for the screening of an intermediate level.

Figure 10:
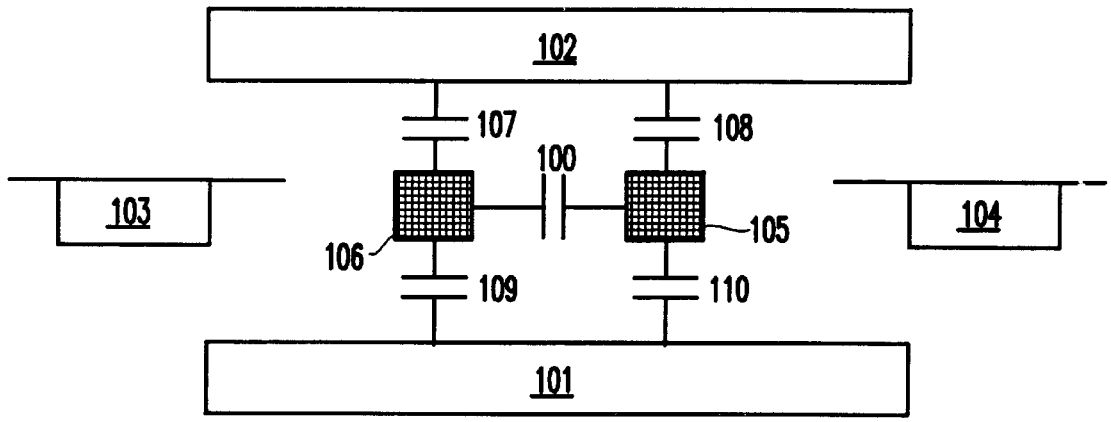
FIG. 10 is a schematic diagram illustrating a cross-sectional view of different levels of an integrated circuit structure that includes fill shapes and the capacitance relationships between the structures.

FIG. 10 is similar to FIG. 9 and includes a first layer 101 and a second layer 102 separated by an intermediate layer having wiring 103 and 104, each of which includes extension regions. In addition, FIG. 10 illustrates fill shapes 106, 105 each of which forms a parallel plate capacitance 107–110 with the adjacent layer 101, 102 and a parallel plate capacitance 100 between the fill shapes. Once again the invention provides a simple method to accommodate fill shapes in the extraction. Fill shapes are floating metal pieces created to equalize the pattern density of a metal level. The pieces are spaced away from design metal (103, 104) to not impact coupling capacitances. The impact of these pieces is to shorten the dielectric between 101 and 102 increasing the capacitance in this situation. The capacitance calculation method includes this manufacturing aid into the capacitance calculation by just changing a fitting parameter used to calculate the capacitance.

Floating metal shapes 105, 106 create a set of series capacitances. These are capacitances 109, 110 from the lower level to the floating shape, which are in series to the capacitors 107, 108 from the floating shape to the upper level. Combing these two parallel plate capacitors leads to an equivalent parallel plate capacitor from the lower conductor to the top conductor with a new larger value than the capacitor without the floating shape. More specifically this new capacitor is equivalent to a parallel plate calculation with a shorter dielectric length. Effectively the floating metal shapes remove their own thickness out of the parallel plate calculation. Therefore by changing the dielectric thickness in the capacitance calculation, the invention includes the effect of the floating metal pieces. Conventional techniques require a more elaborate effort to include these effects.

Figure 11:
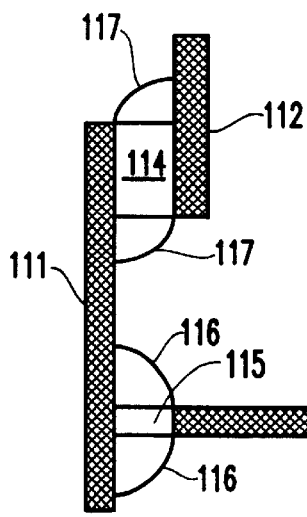
FIG. 11 is a schematic diagram illustrating a top view of adjacent structures within a single plane of an integrated circuit and the fringe capacitance between adjacent structures.
Figure 12:
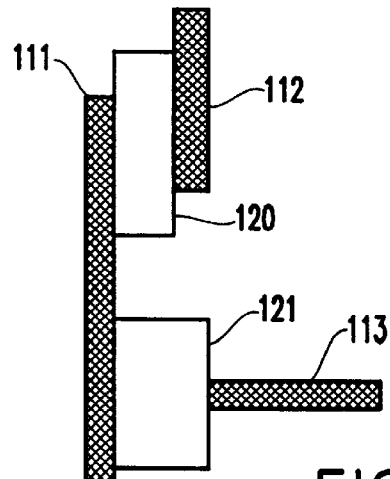
FIG. 12 is a schematic diagram illustrating a top view of adjacent structures within a single plane of an integrated circuit and the fringe capacitance affects between adjacent structures.

As mentioned above, the invention also accommodates the fringe capacitance between adjacent structures on the same wiring level. This feature is shown in FIGS. 11 and 12 that are top views of a single level within an integrated circuit structure. More specifically, wiring patterns 111–113 are included within the same horizontal wiring level. FIG. 11 illustrates the plate to plate capacitance regions 114, 115 and the fringe capacitance regions 117, 116. FIG. 12 illustrates extension regions 120, 121 added by the invention to simulate both the plate to plate capacitance and the fringe capacitance. More specifically, the lateral capacitances 114, 115 between two conductors on the same level are modified to include the lateral fringe capacitances 116, 117. The lateral fringe 116, 117, which is neglected in conventional extraction tools is included by a space dependent increase of the common run length of the conductors in the extension regions 120, 121. This increase in run length is calculated once for a given wiring standard, using a conventional 3-dimensional extraction program and adjusted for each adjacent set of shapes depending upon the proximity of the edges of the shapes. If the distance between the two conductors grows the run length increases also. In the same way as described with respect to FIG. 3 for the vertical fringe, if two lateral extensions of two adjacent conductors overlap, only half of the overlapping region counts for the increase of the lateral capacitance. This is basically the same idea and treatment of fringe capacitance for the lateral effects applied by the invention.

Figure 13:
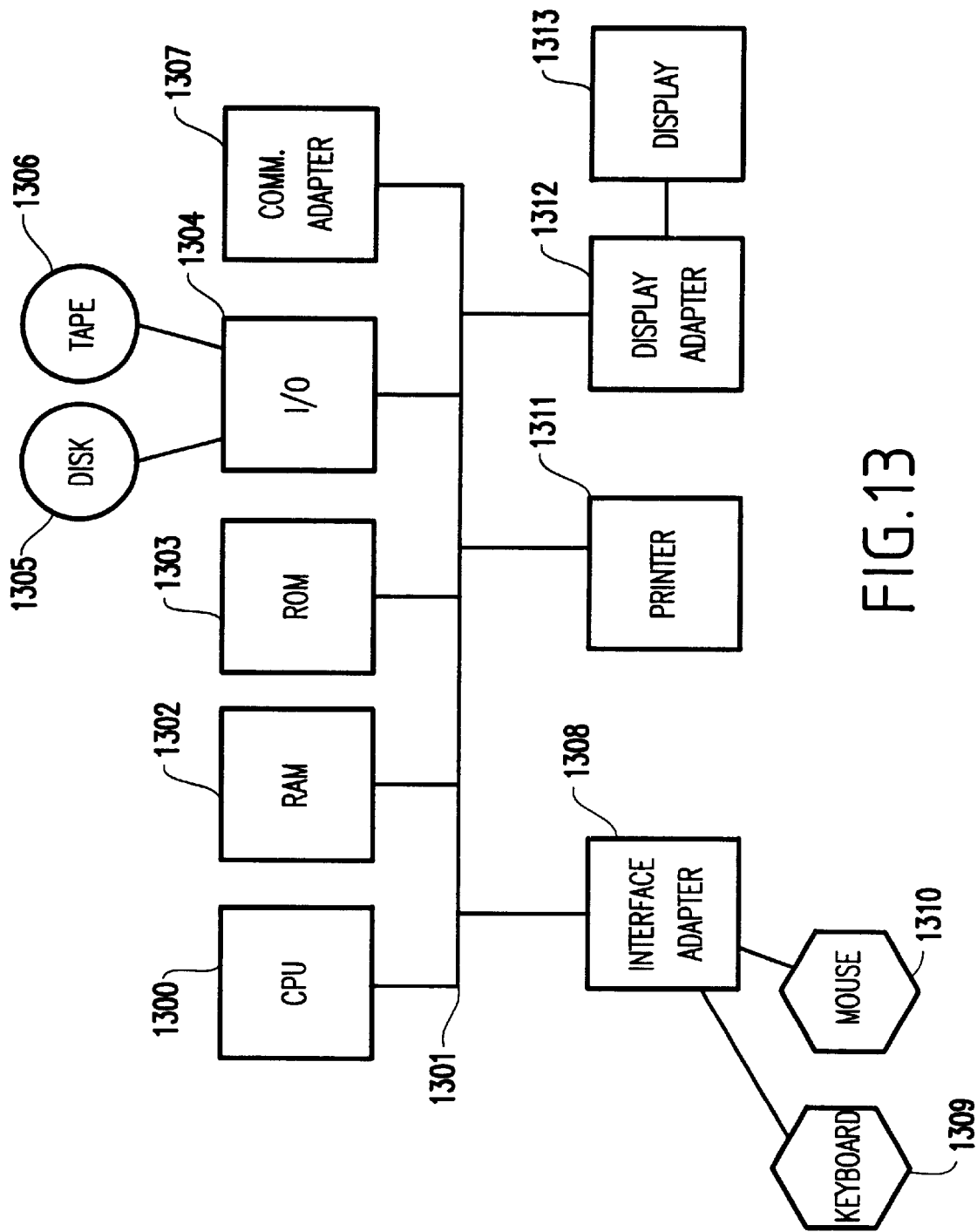
FIG. 13 is a schematic diagram of a hardware embodiment of the invention.

While the overall methodology of the invention is described above, the invention can be embodied in any number of different types of systems and executed in any number of different ways, as would be known by one ordinarily skilled in the art. For example, as illustrated in FIG. 13, a typical hardware configuration of an information handling/computer system in accordance with the invention preferably has at least one processor or central processing unit (CPU) 1300. For example, the central processing unit 1300 could include various image/texture processing units, mapping units, weighting units, classification units, clustering units, filters, adders, subtractors, comparators, etc. Alternatively, as would be known by one ordinarily skilled in the art given this disclosure, multiple specialized CPU's (or other similar individual functional units) could perform the same processing, mapping, weighting, classifying, clustering, filtering, adding, subtracting, comparing, etc.

The CPU 1300 is interconnected via a system bus 1301 to a random access memory (RAM) 1302, read-only memory (ROM) 1303, input/output (I/O) adapter 1304 (for connecting peripheral devices such as disk units 1305 and tape drives 1306 to the bus 1301), communication adapter 1307 (for connecting an information handling system to a data processing network) user interface adapter 1308 (for connecting a peripherals 1309–1310 such as a keyboard, mouse, imager, microphone, speaker and/or other interface device to the bus 1301), a printer 1311, and display adapter 1312 (for connecting the bus 1301 to a display device 1313). The invention could be implemented using the structure shown in FIG. 13 by including the inventive method, described above, within a computer program stored on the storage device 1305. Such a computer program would act on circuit supplied through the interface units 1309–1310 or through the network connection 1307. The system would then automatically perform an extraction on the circuit and output the same on the display 1313, through the printer 1311 or back to the network 1307.

This scheme gives additional fringe capacitance on outside edges of the wire and the appropriate reduction on inside edges. The invention accounts for many effects not typically modeled in extraction tools. Compared to conventional perimeter-based methods, more accurate fringe capacitance values are produced near corners (less capacitance for inside corners, and more capacitance for outside corners) with the invention. In addition, the invention accounts for fringe coupling between two vertical faces of crossing wires, which is a 3-dimensional effect. Further the invention reduces fringe capacitance values based upon proximity of other conductors on the same level and accounts for the fringe coupling between two vertical faces of stacked wires (overlapping wires from different levels running in the same direction). Also, the invention extracts the diagonal coupling between two vertical faces of non-overlapping, yet proximal, wires from different levels. In another aspect, the invention properly handles screening by intermediate levels and properly models "fill shapes" (e.g., shapes not in the original circuit layout but created after circuit design in order to improve manufacturing).

Further, as would be known by one ordinarily skilled in the art given this disclosure, the invention is not limited to the examples shown above. For example, in another embodiment, if coupling to shapes immediately above and below can be lumped to ground (a reasonable solution for static timing or if alternate wiring layers are orthogonal), extension shapes can be merged with original conductor shapes with the invention. This results in a slightly less accurate solution but has a 2X speedup in extraction runtime. This approach is very easy to implement since the invention is based on well-known overlapping shape concepts and rules.

The invention transforms fringe capacitance into area capacitances. Capacitance resulting from the overlapping area is equally distributed to the nodes contributing to this area. This concept is very efficient as it requires only area measurement and includes many physical effects that otherwise create computational difficulties including reduction of fringe capacitance with smaller distance to nearest neighbor, capacitance adjustments for inside and outside corners, fringe capacitance from the side of one wire to the side of the wire on levels above or underneath in crossing and stacked configuration, the change of stacked wire to wire capacitance with center offset, and the screening effect of wires on intermediate levels. In addition, this concept allows just by parameter change the simple inclusion of floating metal shapes, manufacturing aid to ensure pattern density. In addition, this concept includes lateral fringing into ending parallel wires.

The invention is implemented to gain speed and accuracy for capacitance calculations. But as it provides an efficient approach to solve the field equations used to calculate capacitance, all other physical phenomena described by the same set of mathematical equations can also use this invention. For example, the heat flow problem investigating the thermal properties of a network thermal conductors can be analyzed with the invention.

While the invention has been described in terms of preferred embodiments, those skilled in the art will recognize that the invention can be practiced with modification within the spirit and scope of the appended claims.

What is claimed is:

1. A method of determining a fringe capacitance of conductors in an integrated circuit comprising:

building extension shapes around each of said conductors; and using an overlap of said extension shapes between said conductors to determine fringe capacitance.

2. The method in claim 1, wherein said extension shape comprises a two-dimensional shape.

3. The method in claim 1, wherein said overlap reduces a fringe capacitance between adjacent extension shapes within a level of said integrated circuit.

4. The method in claim 1, wherein said fringe capacitance is a product of a constant multiplied by an area within said extension shape.

5. The method in claim 4, wherein said overlap reduces said area within said extension shapes.

6. The method in claim 1, wherein fringe capacitance of an overlapping extension shape is equally divided between networks associated with conductors adjacent said overlapping shape.

7. The method in claim 1, wherein said fringe capacitance is based on a parallel-plate capacitance between each of said extension shapes and an extension shape or device in another level of said integrated circuit.

8. The method in claim 1, wherein said extension shapes are imaginary items added to said integrated circuit for capacitance extraction.

9. The method in claim 1, further comprising extending a run length of horizontal capacitance between devices on a single level of said integrated circuit to determine lateral fringe capacitances on said single level.

10. The method in claim 9, wherein a fringe capacitance of an overlapping run length extension is equally divided between networks associated with conductors adjacent said overlapping run length extension.

11. A method of performing a capacitance extraction on an integrated circuit, said method comprising:

determining a parallel-plate capacitance between devices on different levels within said integrated circuit;

adding extension shapes around each of said devices;

reducing an area of overlapping extension shapes;

multiplying a remaining area of said extension shapes by a constant to produce a fringe capacitance; and summing said parallel-plate capacitance and said fringe capacitance.

12. The method in claim 11, wherein said extension shapes comprise two-dimensional shapes.

13. The method in claim 11, wherein said overlapping adjacent extension shapes within a level of said integrated circuit have reduced fringe capacitances.

14. The method in claim 11, wherein said fringe capacitance is a product of a constant multiplied by an area within said extension shapes.

15. The method in claim 14, wherein said overlapping extension shapes have a reduced area.

16. The method in claim 11, wherein fringe capacitance of an overlapping extension shape is equally divided between networks associated with conductors adjacent said overlapping shape.

17. The method in claim 11, wherein said fringe capacitance is based on a parallel-plate capacitance between each of said extension shapes and an extension shape or device in another level of said integrated circuit.

18. The method in claim 11, wherein said extension shapes are imaginary items added to said integrated circuit for capacitance extraction.

19. The method in claim 11, further comprising extending a run length of horizontal capacitance between devices on a single level of said integrated circuit to determine lateral fringe capacitances on said single level.

20. The method in claim 19, wherein a fringe capacitance of an overlapping run length extension is equally divided between networks associated with conductors adjacent said overlapping run length extension.

21. A program storage device having executable instruction for determining a fringe capacitance of conductors in an integrated circuit comprising:

building extension shapes around each of said conductors; and using an overlap of said extension shapes between said conductors to determine fringe capacitance.

22. The program storage device in claim 21, wherein said extension shape comprises a two-dimensional shape.

23. The program storage device in claim 21, wherein said overlap reduces a fringe capacitance between adjacent extension shapes within a level of said integrated circuit.

24. The program storage device in claim 21, wherein said fringe capacitance is a product of a constant multiplied by an area within said extension shape.

25. The program storage device in claim 24, wherein said overlap reduces said area within said extension shapes.

26. The program storage device in claim 21, wherein fringe capacitance of an overlapping extension shape is equally divided between networks associated with conductors adjacent said overlapping shape.

27. The program storage device in claim 21, wherein said fringe capacitance is based on a parallel-plate capacitance between each of said extension shapes and an extension shape or device in another level of said integrated circuit.

28. The program storage device in claim 21, wherein said extension shapes are imaginary items added to said integrated circuit for capacitance extraction.

29. The program storage device in claim 21, said method further comprising extending a run length of horizontal capacitance between devices on a single level of said integrated circuit to determine lateral fringe capacitances on said single level.

30. The program storage device in claim 29, wherein a fringe capacitance of an overlapping run length extension is equally divided between networks associated with conductors adjacent said overlapping run length extension.

* * * * *